(12) United States Patent
Lim et al.

(10) Patent No.: US 10,367,012 B2
(45) Date of Patent: Jul. 30, 2019

(54) TRANSISTOR AND DISPLAY DEVICE HAVING THE SAME

(71) Applicant: Samsung Display Co., Ltd., Gyeonggi-Do (KR)

(72) Inventors: Jihun Lim, Gyeonggi-do (KR); Jaybum Kim, Seoul (KR); Joonseok Park, Gyeonggi-do (KR); Kyoungseok Son, Seoul (KR); Junhyung Lim, Seoul (KR)

(73) Assignee: Samsung Display Co., Ltd. (KR)

( * ) Notice: Subject to any disclaimer, the term of this patent is extended or adjusted under 35 U.S.C. 154(b) by 8 days.

(21) Appl. No.: 15/657,508

(22) Filed: Jul. 24, 2017

(65) Prior Publication Data

US 2018/0076238 A1    Mar. 15, 2018

(30) Foreign Application Priority Data

Sep. 12, 2016  (KR) ........................ 10-2016-0117118

(51) Int. Cl.
 H01L 29/49    (2006.01)
 H01L 29/788   (2006.01)
 (Continued)

(52) U.S. Cl.
 CPC ........ H01L 27/1251 (2013.01); H01L 27/124 (2013.01); H01L 27/1225 (2013.01); H01L 27/1237 (2013.01); H01L 27/1255 (2013.01); H01L 27/1262 (2013.01); H01L 27/3244 (2013.01); H01L 29/4908 (2013.01); H01L 29/788 (2013.01); H01L 29/7869 (2013.01);
 (Continued)

(58) Field of Classification Search
 CPC .............. H01L 27/3248; H01L 27/124; H01L 27/1229; H01L 27/1233; H01L 27/1237; H01L 27/1251; H01L 27/283; H01L 27/3274; H01L 27/3244–3279; B32B 2457/206
 See application file for complete search history.

(56) References Cited

U.S. PATENT DOCUMENTS 6,624,051 B1 * 9/2003 Ohtani ................ H01L 21/2022
  257/E21.133
6,822,263 B2 * 11/2004 Satou ..................... B23K 26/04
  257/59

(Continued)

FOREIGN PATENT DOCUMENTS

KR    10-2010-0083322 A    7/2010

OTHER PUBLICATIONS

"Twin Thin-Film Transistor Nonvolatile Memory With an Indium-Gallium-Zinc-Oxide Floating Gate," Min-Feng Hung et al., IEEE Electron Device Letters, vol. 34, No. 1, Jan. 2013, pp. 75-77.*

(Continued)

Primary Examiner — Maliheh Malek
(74) Attorney, Agent, or Firm — Innovation Counsel LLP

(57) ABSTRACT

A transistor includes a semiconductor layer comprising a channel portion, a first contact portion and a second contact portion, a gate electrode facing the floating gate, and a floating gate disposed between the semiconductor layer and the gate electrode, the floating gate being insulated from the semiconductor layer and the gate electrode. The floating gate comprises an oxide semiconductor.

12 Claims, 12 Drawing Sheets

(51) Int. Cl.
  *H01L 29/786* (2006.01)
  *H01L 27/12* (2006.01)
  *H01L 27/32* (2006.01)
  *G02F 1/1362* (2006.01)
  *G02F 1/1368* (2006.01)
  *H01L 29/66* (2006.01)

(52) U.S. Cl.
  CPC .. *H01L 29/78609* (2013.01); *H01L 29/78675* (2013.01); *G02F 1/1368* (2013.01); *G02F 1/136213* (2013.01); *G02F 2201/121* (2013.01); *G02F 2201/123* (2013.01); *G02F 2202/10* (2013.01); *H01L 27/3248* (2013.01); *H01L 27/3262* (2013.01); *H01L 27/3265* (2013.01); *H01L 27/3276* (2013.01); *H01L 29/66757* (2013.01); *H01L 29/66825* (2013.01); *H01L 29/66969* (2013.01); *H01L 2227/323* (2013.01)

(56) References Cited

U.S. PATENT DOCUMENTS

| | | | | |
|---|---|---|---|---|
| 7,501,653 | B2* | 3/2009 | Arai | H01L 21/2022 257/59 |
| 8,558,295 | B2* | 10/2013 | Yoon | G11C 11/22 257/295 |
| 8,629,441 | B2* | 1/2014 | Yamazaki | H01L 27/1225 257/290 |
| 9,318,612 | B2* | 4/2016 | Seo | H01L 29/78606 |
| 9,412,876 | B2* | 8/2016 | Koezuka | H01L 29/78693 |
| 9,653,613 | B2* | 5/2017 | Yamazaki | H01L 29/7869 |
| 9,666,722 | B2* | 5/2017 | Matsubayashi | H01L 29/7869 |
| 9,773,820 | B2* | 9/2017 | Okazaki | H01L 27/124 |
| 9,812,587 | B2* | 11/2017 | Yamazaki | H01L 29/78696 |
| 9,871,059 | B2* | 1/2018 | Isobe | H01L 27/1225 |
| 9,880,437 | B2* | 1/2018 | Kusunoki | G02F 1/136286 |
| 9,893,089 | B2* | 2/2018 | Miyairi | H01L 27/1225 |
| 9,905,695 | B2* | 2/2018 | Hanaoka | H01L 29/78606 |
| 9,917,109 | B2* | 3/2018 | Fujii | H01L 27/124 |
| 2006/0267077 | A1* | 11/2006 | Kato | H01L 27/105 257/316 |
| 2007/0152217 | A1* | 7/2007 | Lai | H01L 27/1225 257/59 |
| 2007/0159074 | A1* | 7/2007 | Choi | H01L 27/1251 313/504 |
| 2007/0181881 | A1* | 8/2007 | Koh | G09G 3/3225 257/67 |
| 2008/0073653 | A1* | 3/2008 | Iwasaki | H01L 29/7869 257/79 |
| 2009/0068773 | A1* | 3/2009 | Lai | H01L 27/1225 438/23 |
| 2009/0090954 | A1* | 4/2009 | Yamazaki | H01L 27/105 257/316 |
| 2009/0302319 | A1* | 12/2009 | Cho | H01L 27/1214 257/59 |
| 2010/0085081 | A1* | 4/2010 | Ofuji | H01L 29/7869 326/102 |
| 2010/0296343 | A1* | 11/2010 | Yamazaki | G11C 11/5621 365/185.18 |
| 2011/0042693 | A1* | 2/2011 | Tada | H01L 21/8221 257/88 |
| 2011/0108836 | A1* | 5/2011 | Koyama | H01L 27/1225 257/43 |
| 2011/0156025 | A1* | 6/2011 | Shionoiri | H01L 27/115 257/43 |
| 2012/0033487 | A1* | 2/2012 | Inoue | G11C 11/405 365/149 |
| 2012/0063208 | A1* | 3/2012 | Koyama | G11C 5/025 365/149 |
| 2013/0178013 | A1* | 7/2013 | Wang | H01L 29/66356 438/104 |
| 2013/0181192 | A1* | 7/2013 | Hwang | H01L 51/0093 257/40 |
| 2014/0124750 | A1* | 5/2014 | Chang | H01L 27/3262 257/40 |
| 2014/0160182 | A1* | 6/2014 | Hong | G09G 3/3696 345/691 |
| 2014/0367673 | A1* | 12/2014 | Takahashi | H01L 29/7869 257/43 |
| 2015/0048320 | A1* | 2/2015 | Lee | H01L 27/1255 257/40 |
| 2015/0055051 | A1* | 2/2015 | Osawa | H01L 27/1225 349/48 |
| 2015/0102349 | A1* | 4/2015 | Lee | H01L 27/1255 257/71 |
| 2015/0228803 | A1* | 8/2015 | Koezuka | H01L 29/78693 257/43 |
| 2015/0380451 | A1* | 12/2015 | Kurokawa | H01L 27/14621 257/43 |
| 2016/0098960 | A1* | 4/2016 | Park | G09G 3/3233 345/205 |
| 2016/0155849 | A1* | 6/2016 | Noda | H01L 29/7869 257/43 |
| 2016/0172410 | A1* | 6/2016 | Kurokawa | H01L 27/14643 257/42 |
| 2016/0211266 | A1* | 7/2016 | Kurokawa | H01L 27/1225 |
| 2017/0046006 | A1* | 2/2017 | Kim | G02F 1/13338 |
| 2017/0092198 | A1* | 3/2017 | Ryu | G09G 3/3275 |
| 2017/0110459 | A1* | 4/2017 | Saito | H01L 27/1052 |
| 2017/0123268 | A1* | 5/2017 | Sasaki | G02F 1/133553 |
| 2017/0243759 | A1* | 8/2017 | Jintyou | H01L 21/385 |
| 2017/0278973 | A1* | 9/2017 | Ando | H01L 27/1222 |
| 2017/0287399 | A1* | 10/2017 | Ahmed | G09G 3/3233 |
| 2017/0294460 | A1* | 10/2017 | Lee | H01L 27/1251 |
| 2017/0317111 | A1* | 11/2017 | Ando | H01L 27/1052 |
| 2017/0373195 | A1* | 12/2017 | Yamazaki | H01L 29/24 |
| 2018/0033807 | A1* | 2/2018 | Matsuda | H01L 27/1052 |
| 2018/0040641 | A1* | 2/2018 | Yamazaki | H01L 27/1225 |
| 2018/0053791 | A1* | 2/2018 | Sung | H01L 27/1222 |
| 2018/0061920 | A1* | 3/2018 | Son | H01L 27/3262 |
| 2018/0061921 | A1* | 3/2018 | Son | H01L 27/3262 |
| 2018/0069190 | A1* | 3/2018 | Kim | H01L 51/5203 |
| 2018/0083084 | A1* | 3/2018 | Kim | H01L 27/3262 |
| 2018/0166472 | A1* | 6/2018 | Liang | G02F 1/1368 |

OTHER PUBLICATIONS

"Dual gate indium-gallium-zinc-oxide thin film transistor with an unisolated floating metal gate for threshold voltage modulation and mobility enhancement," Hsiao-Wen Zan et al., Applied Physics Letters 98, 153506, 2011.*

"Flexible double gate a-IGZO TFT fabricated on free standing polyimide foil," Niko Munzenrieder et al., Solid-State Electronics 84 (2013), 198-204.*

"Electrical characteristics of bendable a-IGZO thin-film transistors with split channels and top-gate structure," Hyungon Oh et al., Microelectronic Engineering 159 (2016), 179-183.*

"Top-Gate Staggered a-Igzo TFTs Adopting the Bilayer Gate Insulator for Driving AMOLED," Chang-Yu Lin et al., IEEE Transactions on Electron Devices, vol. 59, No. 6, Jun. 2012.*

"Top Gate Amorphous In—Ga—Zn—O Thin Film Transistors Fabricated on Soda—Lime—Silica Glass Substrates," Gwanghyeon Baek et al., 2014.*

"A Nonvolatile InGaZnO Charge-Trapping-Engineered Flash Memory With Good Retention Characteristics," Nai-Chao Su et al., IEEE Electron Device Letters, vol. 31, No. 3, Mar. 2010.*

* cited by examiner

TRANSISTOR AND DISPLAY DEVICE HAVING THE SAME

CROSS-REFERENCE TO RELATED APPLICATION

This U.S. application claims priority to Korean Patent Application No. 10-2016-0117118, filed on Sep. 12, 2016, the contents of which in its entirety is herein incorporated by reference in its entirety.

BACKGROUND

1. Field of Disclosure

The present disclosure relates to a memory transistor and a display device having the same. More particularly, the present disclosure relates to a memory transistor capable to improve memory efficiency and a display device having the memory transistor.

2. Description of the Related Art

An organic light emitting display device comprises a plurality of pixels. Each of the pixels comprises an organic light emitting diode and a circuit controlling the organic light emitting diode.

The organic light emitting diode includes an anode, a cathode and an organic light emitting layer disposed between the anode and the cathode. The organic light emitting diode emits light when a voltage greater than a threshold voltage of the organic light emitting layer is applied between the anode and the cathode.

The circuit comprises a control transistor, a driving transistor and a storage capacitor. The driving and control transistors are transistors having a semiconductor material as a channel layer. Each of the driving and control transistors may include a same semiconductor material, but recently a structure using different semiconductor materials for the driving and control transistors has been developed.

In addition, recently the display device with a low power consumption structure uses a transistor having a memory function as the driving and control transistors.

SUMMARY

The present disclosure provides a transistor having a memory function and capable to improve controllability of the threshold voltage.

The present disclosure provides a display device having the transistor and capable to reduce leakage current and minimize the power consumption.

Embodiments of the inventive concept provide a transistor including a semiconductor layer comprising a channel portion, a first contact portion and a second contact portion, a floating gate facing the channel portion of the semiconductor layer, a gate electrode facing the floating gate, and a floating gate disposed between the semiconductor layer and the gate electrode, and source electrode and drain electrode contacted with the first contact portion and the second contact portion, respectively. The floating gate comprises an oxide semiconductor.

Embodiments of the inventive concept provide a display device including a first line, a second line different from the first line, a switching transistor connected to the first and second lines, and a display element connected to the switching transistor.

The switching transistor comprises a first semiconductor layer comprising a channel portion, a first contact portion and a second contact portion, a floating gate facing the channel portion of the first semiconductor layer, a gate electrode facing the floating gate, and source electrode and drain electrode contacted with the first contact portion and the second contact portion, respectively. The floating gate comprises an oxide semiconductor.

According to the above, the transistor includes a floating gate formed from an oxide semiconductor. When the floating gate formed from the oxide semiconductor, the ability to change the threshold voltage by trapping or controlling the charge from the floating gate is improved, thereby reducing the leakage current.

In addition, the floating gate formed from the oxide semiconductor is further disposed in the transistor performing a memory function the display device. Therefore, power consumption can be effectively reduced when the display device is driven with low power.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
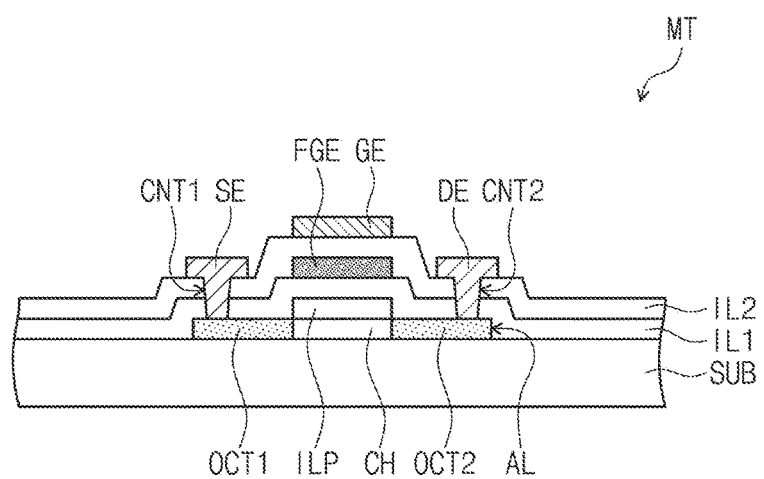
FIG. 1 is a cross-sectional view showing a memory transistor according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present inventive concept will be explained in detail with reference to the accompanying drawings.

FIG. 1 is a cross-sectional view showing a memory transistor according to an exemplary embodiment of the present disclosure.

Referring to FIG. 1, a memory transistor MT is disposed on a base substrate SUB. In the exemplary embodiment of the present disclosure, the memory transistor MT comprises a semiconductor layer AL, a floating gate FGE, a gate electrode GE, source and drain electrodes SE and DE.

The semiconductor layer AL includes a channel portion CH, a first contact portion OCT1, and a second contact portion OCT2. The channel portion CH is a channel region of the memory transistor MT. In the exemplary embodiment of the present disclosure, the semiconductor layer AL may comprise poly silicon. The first and second contact portions OCT1 and OCT2 may be regions comprising dopants. The first and second contact portions OCT1 and OCT2 may be doped with impurities such as implanted n+ dopant or p+ dopant. The dopants implanted into the first and second contact portions OCT1 and OCT2 may be changed depending on a type of the memory transistor MT. In the exemplary embodiment of the present disclosure, the memory transistor MT may be an N-type transistor, but types of the memory transistor MT according to the present disclosure should not be limited thereto. In case that the memory transistor MT is the N-type transistor, the first and second contact portions OCT1 and OCT2 may be n+ doped regions. The channel portion CH is formed between the first and second contact portions OCT1 and OCT2.

The memory transistor MT1 may further comprise an insulating pattern ILP. After disposing the insulating pattern ILP in the region corresponding to the channel portion CH of the semiconductor layer AL, the dopant may be implanted into the regions to form the first and second contact portions OCT1 and OCT2 of the semiconductor layer AL. In the exemplary embodiment of the present disclosure, the insulating pattern ILP may comprise an inorganic material such as silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials. The memory transistor MT may further comprise a first insulating layer IL1 covering the semiconductor layer AL and the insulating pattern ILP. The first insulating layer IL1 may comprise an inorganic material such as silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials. The floating gate FGE is formed on the first insulating layer IL1.

The floating gate FGE is formed on the first insulating layer IL1 to face the channel portion CH of the semiconductor layer AL. The floating gate FGE comprises an oxide semiconductor. In the exemplary embodiment of the present disclosure, the oxide semiconductor may comprise a metal oxide such as zinc Zn, Indium In, gallium Ga, tin Sn, titanium Ti, etc., or a combination of a metal oxide such as zinc Zn, Indium In, gallium Ga, tin Sn, titanium Ti, etc., and oxides thereof. More particular, the oxide semiconductor may comprise zinc oxide ZnO, zinc-tin oxide ZTO, zinc-indium oxide ZIO, indium oxide InO, titanium oxide TiO, indium-gallium-zinc oxide IGZO, indium-zinc-tin oxide IZTO, etc.

In order to improve an electrical conductivity of the floating gate FGE, a hydrogen H plasma process may be performed on the oxide semiconductor. In the exemplary embodiment of the present disclosure, the IGZO having hydrogen doping concentration of $1E+17/cm^3$ or more may be used as the floating gate FGE.

The memory transistor MT may further comprise a second insulating layer IL2 covering the floating gate FGE, and the gate electrode GE is formed on the second insulating layer IL2. The second insulating layer IL2 may comprise an inorganic material of silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials. In FIG. 1, the second insulating layer IL2 has a single layer structure, but the inventive concept is not limited thereto. In the single layer structure, the second insulating layer IL2 may comprise silicon nitride SiNx. In case that the second insulating layer IL2 has a double layer structure, the second insulating layer IL2 may comprise a lower layer and an upper layer sequentially stacked. In the exemplary embodiment of the present disclosure, the lower layer may comprise silicon oxide SiOx, and the upper layer may comprise silicon nitride SiNx.

The gate electrode GE is disposed on the second insulating layer IL2 to face the floating gate FGE. The gate electrode GE may comprise a metal material.

A first contact hole CNT1 and a second contact hole CNT2 are formed through the first and second insulating layers IL1 and IL2 to expose the first and second contact portions OCT1 and OCT2. The first and second contact holes CNT1 and CNT2 pass through the first and second insulating layers IL1 and IL2 and partially expose the first and second contact portions OCT1 and OCT2, respectively.

The source and drain electrodes SE and DE are formed on the second insulating layer IL2 and are contacted with the first and second contact portions OCT1 and OCT2 through the first and second contact holes CNT1 and CNT2, respectively. The source and drain electrodes SE and DE may comprise a metal material. The source and drain electrodes SE and DE may be formed of a same metal material as the gate electrode GE. In this case, the gate electrode GE, the source and drain electrodes SE and DE may be simultaneously patterned via a same photolithography process, but the inventive concept is not limited thereto. The gate electrode GE and the source/drain electrodes SE and DE may be formed of different materials and be patterned via different photolithography processes. The gate electrode GE and the source/drain electrodes SE and DE may be formed on different layers.

Figure 2:
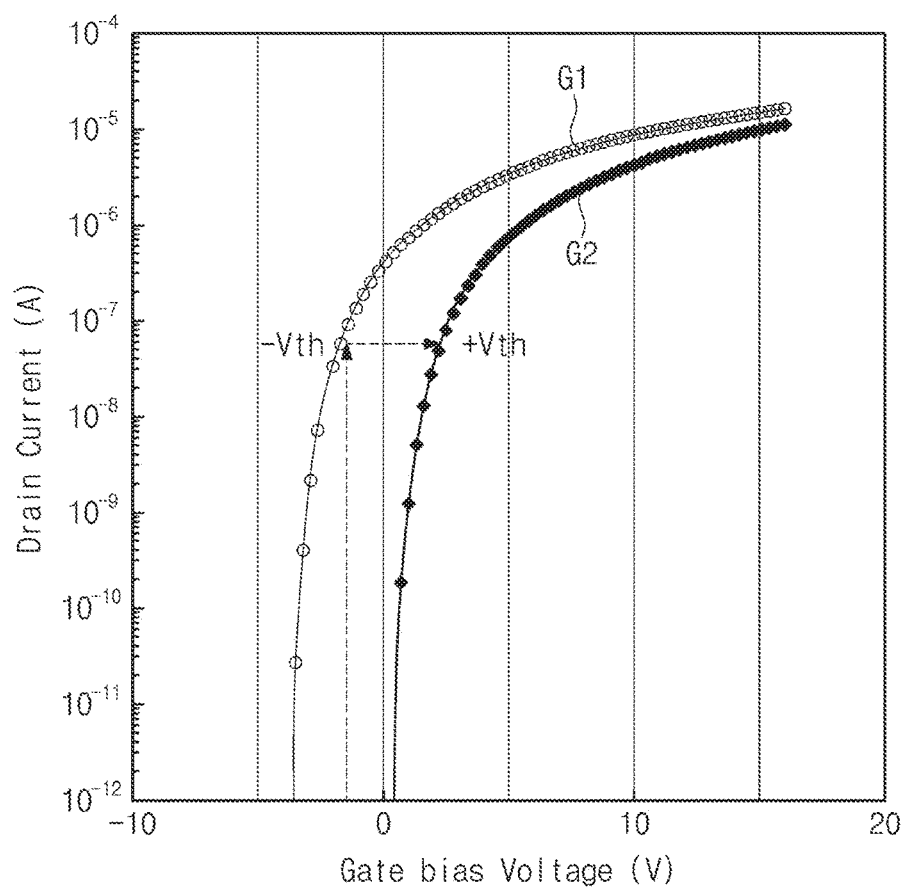
FIG. 2 is a waveform diagram showing a shift of the threshold voltage according to gate voltage applied to the gate electrode shown in FIG. 1.

FIG. 2 is a waveform diagram showing a shift of the threshold voltage according to gate voltage applied to the gate electrode shown in FIG. 1. In FIG. 2, an x-axis represents gate bias voltages V applied to the gate electrode GE, and a y-axis represents drain currents A.

Referring to FIG. 1 and FIG. 2, when a sufficient voltage is applied to the gate electrode GE, the channel is formed in the channel portion CH by the carriers, and then the current from the source electrode SE of the memory transistor MT to the drain electrode DE of the memory transistor MT flows through the channel. As shown in FIG. 1, in the memory transistor MT having the floating gate FGE, a first capacitor is formed between the channel CH and the floating gate FGE, and a second capacitor is formed between the gate electrode GE and the floating gate FGE, The first capacitor and the second capacitor is connected in series.

The charge trapped or removed in the floating gate FGE changes the threshold voltage Vth of the memory transistor MT. In FIG. 2, a first graph G1 represents a status before charge is trapped in the floating gate FGE. As shown in a second graph G2 of FIG. 2, when the bias voltage applied to the gate electrode GE is changed, the charge is trapped in the floating gate FGE. When the charge is trapped in the floating gate FGE, the threshold voltage Vth of the memory transistor MT is changed. For example, as shown in the second graph G2, the threshold voltage Vth may be shift to the plus voltage (+) when the charge is trapped in the floating gate FGE.

According to the present disclosure, the floating gate FGE comprises the oxide semiconductor having high conductivity. The oxide semiconductor is advantageous for charging of carrier because the oxide semiconductor has relatively wide band gap and can make trap sites more useful than poly silicon. Therefore, when the floating gate FGE comprises the oxide semiconductor, the ability of changing the threshold voltage Vth by trapping or controlling charge from the floating gate FGE may be improved.

The memory transistor MT having the structure shown in FIG. 1 may apply to a display element of a display device (for example, an organic light emitting diode or a liquid crystal display device) as a transistor having a memory function.

Figure 3:
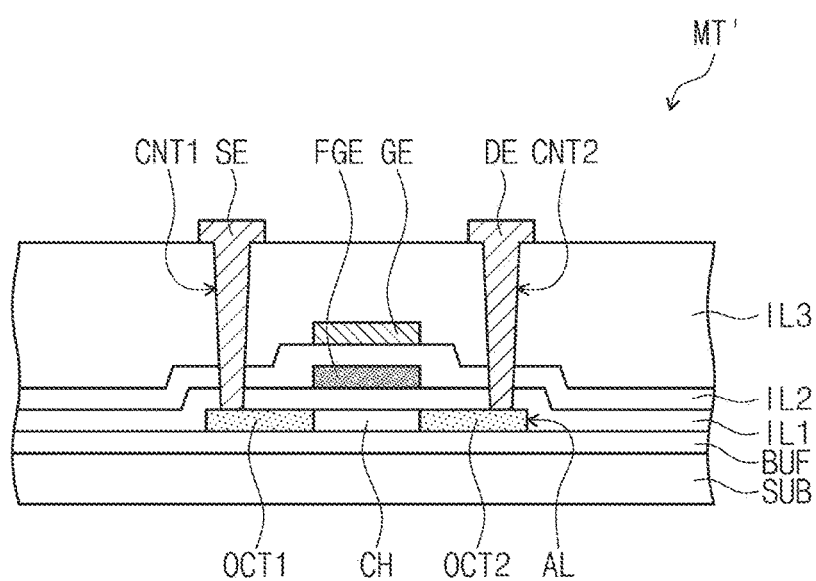
FIG. 3 is a cross-sectional view showing a memory transistor according to an exemplary embodiment of the present disclosure.

FIG. 3 is a cross-sectional view showing a memory transistor according to an exemplary embodiment of the present disclosure. However, like reference numerals refer to like elements throughout FIGS. 5 and 7 and their detailed descriptions are omitted.

Referring to FIG. 3, a buffer layer BUF is formed on the base substrate SUB. A memory transistor MT' is formed on the buffer layer BUF. The buffer layer BUF is formed before performing a thin film process to form the memory transistor MT' on the base substrate SUB, thereby preventing a diffusion of moisture or impurities into the memory transistor MT'.

The semiconductor layer AL is formed on the buffer layer BUF, and the first insulating layer IL1 is disposed on the semiconductor layer AL. The first insulating layer IL1 comprises silicon oxide SiOx.

The floating gate FGE is formed on the first insulating layer ILL The first and second contact regions OCT1 and OCT2 are doped with impurities through a doping process using the floating gate FGE as a mask.

Because of the channel portion CH of the semiconductor layer AL corresponds to a region in which the floating gate is disposed, the channel portion CH is not doped during the doping process. Therefore, the channel portion CH is defined as a channel region of the memory transistor MT'. In the exemplary embodiment of the present disclosure, the semiconductor layer AL may comprise poly silicon.

The floating gate FGE may comprise an oxide semiconductor. In the exemplary embodiment of the present disclosure, the oxide semiconductor may comprise a metal oxide such as zinc Zn, Indium In, gallium Ga, tin Sn, titanium Ti, etc., or a combination of a metal oxide such as zinc Zn, Indium In, gallium Ga, tin Sn, titanium Ti, etc., and oxides thereof. More particular, the oxide semiconductor may comprise zinc oxide ZnO, zinc-tin oxide ZTO, zinc-indium oxide ZIO, indium oxide InO, titanium oxide TiO, indium-gallium-zinc oxide IGZO, indium-zinc-tin oxide IZTO, etc.

In addition, according to the present disclosure, the floating gate FGE is an n-type oxide semiconductor, for example, the IGZO having a doping concentration of $1E+17/cm^3$ or more may be used as the floating gate FGE.

The memory transistor MT' may further comprise the second insulating layer IL2 covering the floating gate FGE. The second insulating layer IL2 may comprise an inorganic material of silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials.

The gate electrode GE is disposed on the second insulating layer IL2 to face the floating gate FGE. The gate electrode GE may comprise a metal material.

The gate electrode GE is covered by a third insulating layer IL3, and a first contact hole CNT1 and a second contact hole CNT2 are formed through the first to third insulating layers ILL IL2 and IL3 to expose the first and second contact portions OCT1 and OCT2. The third insulating layer IL3 may comprise an inorganic material of silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials.

The source and drain electrodes SE and DE are formed on the third insulating layer IL3. The source electrode SE is directly contacted with the first contact portion OCT1 via the first contact hole CNT1, and the drain electrode DE is directly contacted with the second contact portion OCT2 via the second contact hole CNT2.

Figure 4:
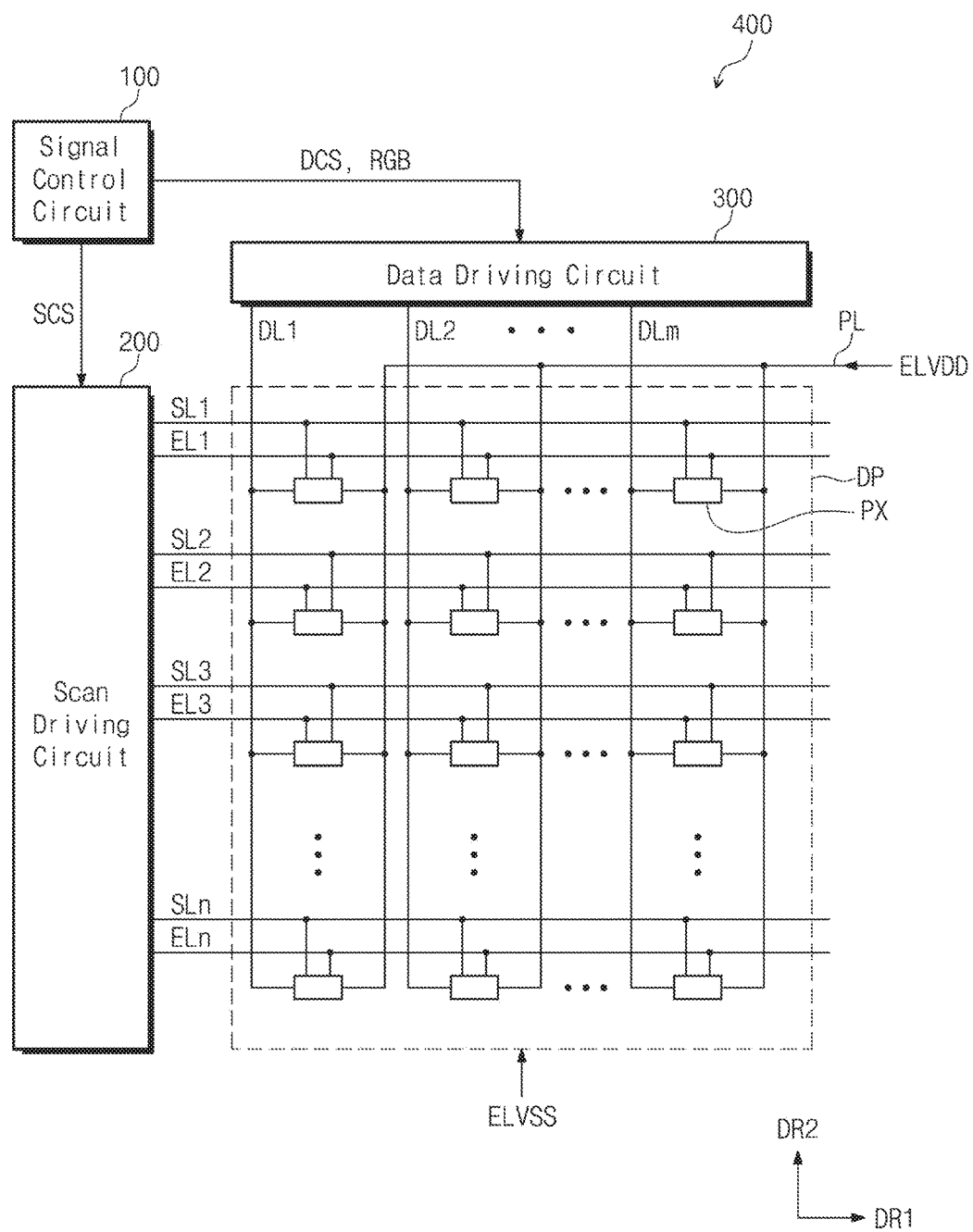
FIG. 4 is a block diagram showing an organic light emitting display device according to an exemplary embodiment of the present disclosure.

FIG. 4 is a block diagram showing an organic light emitting display device according to an exemplary embodiment of the present disclosure.

As shown in FIG. 4, an organic light emitting display device 400 comprises a signal control circuit 100, a scan driving circuit 200, a data driving circuit 300, and an organic light emitting display panel DP.

The signal control circuit 100 receives input image signals (not shown) and converts a data format of the input image signals to be suitable for the specification of the data driving circuit DDC and generate image data RGB. The signal control circuit 100 outputs the image data RGB and various control signals DCS and SCS.

The scan driving circuit 200 receives a scan control signal SCS from the signal control circuit 100. The scan control signal SCS may comprise a vertical start signal for starting an operation of the scan driving circuit 200 and a clock signal for determining an output timing of the signals. The scan driving circuit 200 generates a plurality of scan signals and sequentially outputs the plurality of scan signals to a plurality of scan lines SL1 to SLn which will be described later. In addition, the scan driving circuit 200 generates a plurality of light emitting control signals in response to the scan control signal SCS and outputs the plurality of light emitting control signals to a plurality of light emitting lines EL1 to ELn which will be described later.

Although, FIG. 4 shows the plurality of scan signals and the plurality of light emitting control signals outputted from one scan driving circuit 200, but the inventive concept is not limited thereto. In another exemplary embodiment of the present disclosure, the scan driving circuit 200 outputs only the scan signals and the organic light emitting display device 400 may further comprise a separate light emitting control circuit (not shown) to output the light emitting control signals.

The data driving circuit 300 receives the image data RGB and a data control signal DCS from the signal control circuit 100. The data driving circuit 300 converts the image data RGB into data signals and outputs the data signals to a plurality of data lines DL1 to DLm which will be described later. The data signals are analog voltages corresponding to gray values of the image data RGB.

The organic light emitting display panel DP comprises the plurality of scan lines SL1 to SLn, the plurality of light emitting lines EL1 to ELn, the plurality of data lines DL1 to DLm, and a plurality of pixels PX. The plurality of scan lines SL1 to SLn extend in a first direction DR1 and arranged in a second direction DR2 substantially perpendicular to the first direction DR1. Each of the plurality of light emitting lines EL1 to ELn may be arranged substantially parallel to a corresponding scan line of the plurality of scan lines SL1 to SLn. The plurality of data lines DL1 to DLm are insulated with and cross the plurality of scan lines SL1 to SLn.

Each of the plurality of pixel PX is connected to a corresponding scan line of the plurality of scan lines SL1 to SLn, a corresponding light emitting lines of the plurality of light emitting lines EL1 to ELn and a corresponding data line of the plurality of data lines DL1 to DLm. Each of the plurality of pixels PX receives a power voltage ELVDD and a reference voltage ELVSS having a lower voltage level than the power voltage ELVDD. Each of the plurality of pixel PX is connected to a power line PL where the power voltage ELVDD is applied to receive the power voltage ELVDD.

Each of the plurality of pixels PX comprises an organic light emitting diode (not shown) and a circuit (not shown) controlling an operation of the organic light emitting diode. The circuit may comprise a plurality of thin film transistor (hereinafter, referred to as the transistor) and a capacitor. The plurality of pixels PX may comprise red pixels emitting a red color, green pixels emitting a green color and blue pixels emitting a blue color. The organic light emitting diode of the red pixel, the organic light emitting diode of the green pixel, and the organic light emitting diode of the blue pixel may comprise organic light emitting layers having different materials from each other, respectively.

The plurality of scan lines SL1 to SLn, the plurality of light emitting lines EL1 to ELn, the plurality of data lines DL1 to DLm, the power line PL, and the plurality of pixels PX may be formed on a base substrate SUB (shown in FIG. 3) through a photolithography process of plural times. A plurality of insulating layers may be formed on the base substrate SUB through a deposition process of plural times and a coating process of plural times. The insulating layers may comprise an organic layer and/or an inorganic layer. In addition, an encapsulation layer (not shown) protecting the plurality of pixels PX may be further formed on the base substrate SUB.

Figure 5:
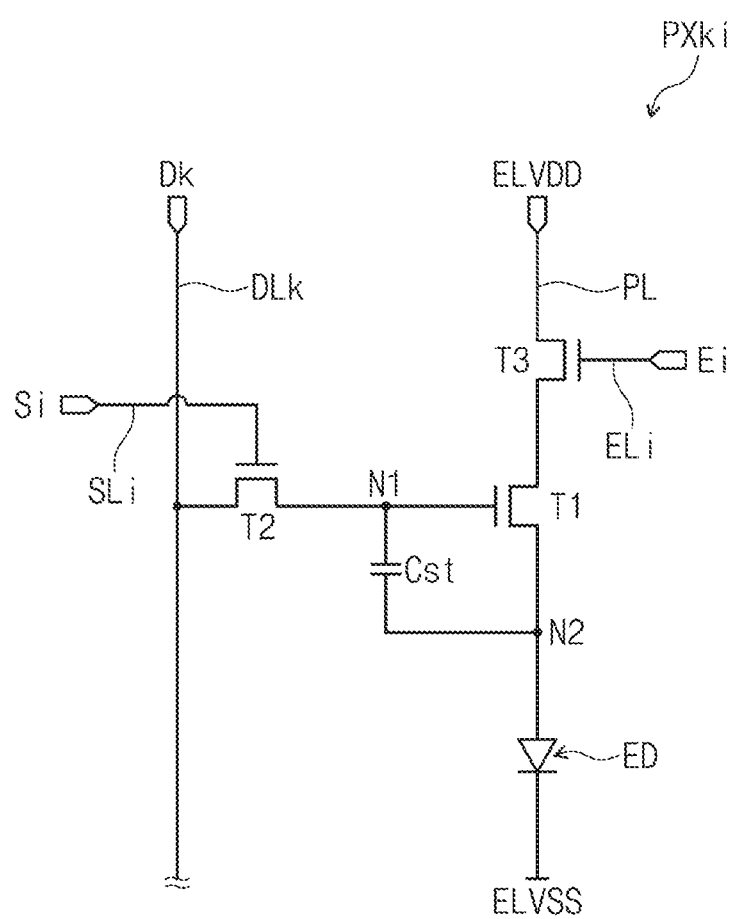
FIG. 5 is a circuit diagram showing a pixel shown in FIG. 4.

FIG. 5 is an equivalent circuit diagram of the pixel shown in FIG. 4.

In FIG. 5, a k×i-th pixel PXki connected to a k-th data line DLk among the plurality of data lines DL1 to DLm and connected to an i-th scan line SLi among the plurality of scan lines SL1 to SLm is shown as an example.

The k×i-th pixel PXki comprises an organic light emitting diode ED and a circuit unit controlling the organic light emitting diode ED. The circuit may comprise a first transistor Ti, a second transistor T2, a third transistor T3, and a capacitor Cst. Hereinafter, the first to third transistors T1 to T3, comprising n-type thin film transistor, is illustrated as an example. The circuit unit shown in FIG. 2 is shown as an example, and a configuration of the circuit unit may be modified.

The first transistor T1 among the first to third transistors T1 to T3 is a driving transistor for controlling the driving current applied to the organic light emitting diode ED, and the second and third transistors T2 and T3 are control transistors for controlling the first transistor T1. The control transistors may comprise a plurality of transistors. In the exemplary embodiment of the present disclosure, the control transistors comprising the second and third transistors T2 and T3 is illustrated as an example, but is not limited thereto, The control transistors may comprises at least two transistors. In addition, the connection structure of the second and third transistors T2 and T3 is not limited thereto.

The control transistors may receive plurality of pixel control signals. The pixel control signals applied to the k×i-th pixel PXki may comprises an i-th scan signal Si, a k-th data signal Dk, and an i-th light emitting control signal Ei.

The first transistor T1 comprises a first control electrode, a first input electrode, and a first output electrode. The first input electrode receives the power voltage ELVDD through the third transistor T3. The first output electrode is connected to the anode of the organic light emitting diode ED and supply the power voltage ELVDD to the anode. The cathode of the organic light emitting diode ED receives the reference voltage ELVSS.

The first control electrode is connected to the first node N1. A node at which the first output electrode and the anode of the organic light emitting diode ED are connected is a second node N2.

The second transistor T2 comprises a second control electrode, a second input electrode, and a second output electrode. The second control electrode is connected to the first scan line SLi and receives the i-th scan signal Si, the second input electrode is connected to the k-th data line DLk and receives the k-th data signal Dk, and the second output electrode is connected to the first node N1. When the second transistor T2 is turned on in response to the i-th scan signal Si, the k-th data signal Dk is applied to the first node N1. The first transistor T1 controls the driving current supplied to the organic light emitting diode ED depending on the electric potential of the first node N1.

The third transistor T3 comprises a third control electrode, a third input electrode, and a third output electrode. The third control electrode is connected to the i-th light emitting line Eli and receives the i-th light emitting control signal Ei, the third input electrode is connected to the power line PL to receive the power voltage ELVDD, and the third output electrode is connected to the first input electrode of the first transistor T1. The third transistor T3 is switched by the i-th light emitting control signal Ei to supply the power voltage ELVDD to the first transistor T1.

The storage capacitor Cst is disposed between the first node N1 and the second node N2. When the second transistor T2 is turned on in response to the i-th scan signal Si, the k-th data signal Dk is stored to the storage capacitor Cst. Therefore, level of a voltage charged in the storage capacitor Cst may be changed depending on the k-th data signal Dk.

The second transistor T2 among the first to third transistors T1 to T3 shown in FIG. 5 may be memory transistor capable to perform the memory function in the low power mode. In this case, similar to the memory transistor shown in FIG. 1, the second transistor T2 may comprise a floating gate FGE formed of the oxide semiconductor.

Hereinafter, referring to FIG. 6, FIG. 7A to FIG. 7G the structure and manufacturing process of the first and second transistors T1 and T2 will be illustrated in detail.

Figure 6:
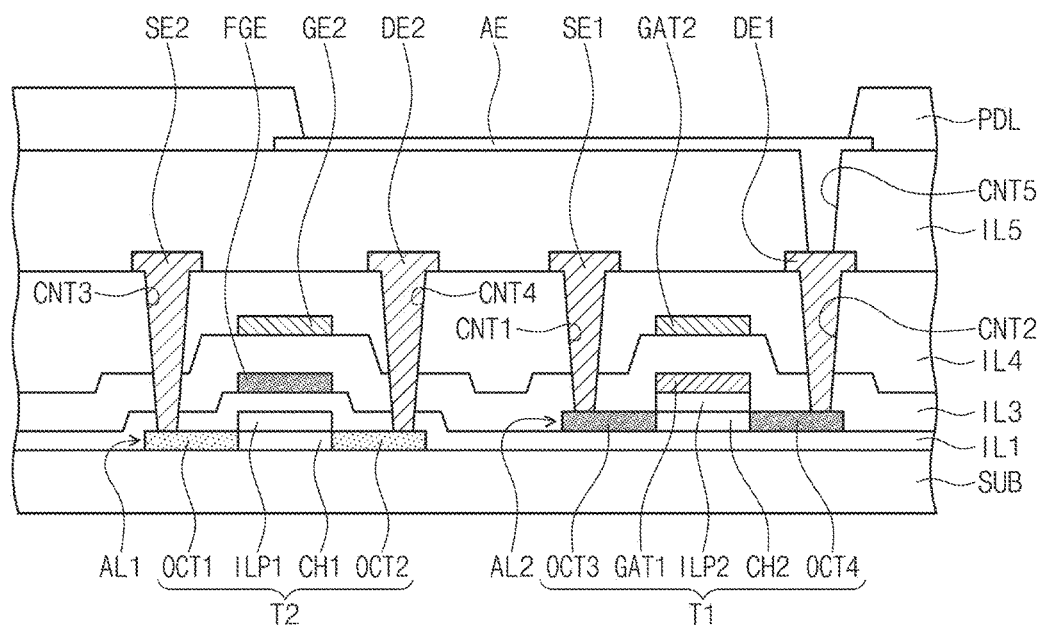
FIG. 6 is a cross-sectional view the pixel shown in FIG. 5.

FIG. 6 is a cross-sectional view the pixel shown in FIG. 5, and FIG. 7A to FIG. 7G are cross-sectional views showing a process of manufacturing the pixel shown in FIG. 6.

Referring to FIG. 6, a first semiconductor layer AL1 is formed on the base substrate SUB.

The first semiconductor AL1 comprises a first channel portion CHL a first contact portion OCT1, and a second contact portion OCT2. The first channel portion CH1 is a channel region of the second transistor T2. The first semiconductor layer AL1 may comprise low temperature poly silicon. The first and second contact portions OCT1 and OCT2 may be regions comprising dopants. The first and second contact portions OCT1 and OCT2 may be doped regions which are doped with n+ dopant or p+ dopant by an ion implantation technique. The type of the second transistor T2 may be changed depending on the dopants implanted into the first and second contact portions OCT1 and OCT2. In the exemplary embodiment of the present disclosure, the second transistor T2 may be an N-type transistor, but types of the second transistor T2 according to the present disclosure should not be limited thereto. In case that the second transistor T2 is the N-type transistor, the first and second contact portions OCT1 and OCT2 may be n+ doped regions. The first channel portion CH1 is formed between the first and second contact portions OCT1 and OCT2.

Figure 7A:
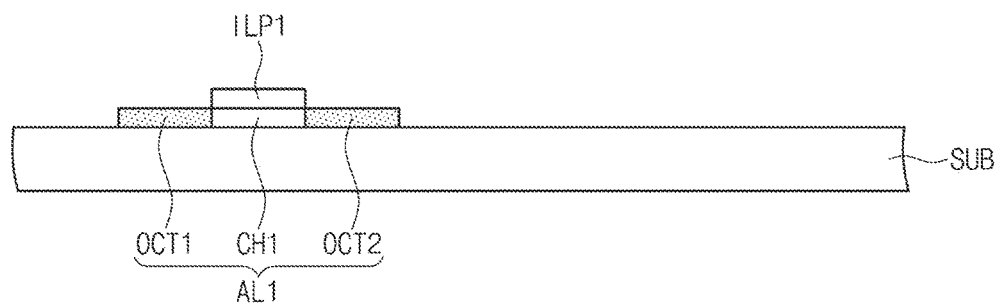
FIG. 7A, 7B, 7C, 7D, 7E, 7F and FIG. 7G are cross-sectional views showing a process of manufacturing the pixel shown in FIG. 6.

Referring to FIG. 6 and FIG. 7A, after forming a first semiconductor material (not shown) on the base substrate SUB, the first semiconductor material is patterned to form a first semiconductor pattern. Step of forming the first semiconductor pattern may comprise step of crystalizing the first semiconductor material.

After forming an insulating material (not shown) on the first semiconductor pattern, a first insulating pattern ILP1 is formed by pattering the insulating material. The insulating material may comprise a silicon oxide.

The dopants are implanted into the first semiconductor pattern using the first insulating pattern ILP1 as a mask. In particular, the first semiconductor pattern AL1 includes first to third regions, the first insulating pattern ILP1 is disposed on the second region of the first semiconductor pattern ILP1 which is a first channel portion CH1, the first and third regions of the first semiconductor pattern ILP1 isn't covered by the first insulating pattern ILP1. Therefore, the first and third regions are doped with the dopants, and then the first and second contact portion OCT1 and OCT2 are formed. The dopants may comprise a trivalent element or a pentavalent element. When the dopants comprise the trivalent element, a P-type semiconductor may be formed, and when the dopants comprise the pentavalent element, an N-type semiconductor may be formed.

Because of the second region is covered by the first insulating pattern ILP1, the second region is not doped during the dopant implanting process. The second region is defined as the first channel portion CH1 of the first semiconductor layer AL1. The first insulating pattern ILP1 acts as the mask of the dopant implanting process. Thus, a boundary between the first region and the second region is aligned with the first side of the first insulating pattern ILP1, and a boundary between the second region and the third region is as aligned with the second side of the first insulating pattern ILP1.

In FIG. 6 and FIG. 7A, the structure with the first insulating pattern ILP1 is shown, but the first insulating pattern ILP1 may be omitted as shown in FIG. 3.

Figure 7B:
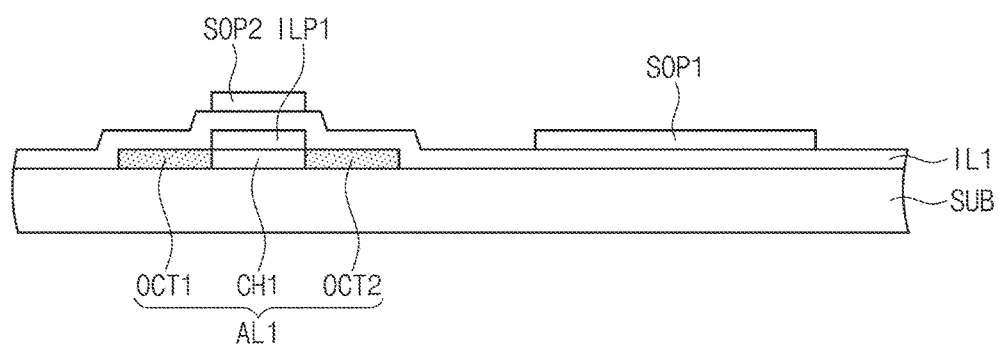

As shown in FIG. 6 and FIG. 7B, the first semiconductor layer AL1 and the first insulating pattern ILP1 are covered by the first insulating layer IL1 In the exemplary embodiment of the present disclosure, the first insulating layer IL1 may comprise an inorganic material of silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials.

First and second oxide semiconductor patterns SOP1 and SOP2 are formed on the first insulating layer IL1. The first and second oxide semiconductor patterns SOP1 and SOP2 may comprise an oxide semiconductor. The oxide semiconductor may comprise a metal oxide such as zinc Zn, Indium In, gallium Ga, tin Sn, titanium Ti, etc., or a combination of a metal oxide such as zinc Zn, Indium In, gallium Ga, tin Sn, titanium Ti, etc., and oxides thereof. More particular, the oxide semiconductor may comprise zinc oxide ZnO, zinc-tin oxide ZTO, zinc-indium oxide ZIO, indium oxide InO, titanium oxide TiO, indium-gallium-zinc oxide IGZO, indium-zinc-tin oxide IZTO, etc.

On the other hand, the first and second oxide semiconductor patterns SOP1 and SOP2 may comprise a crystalized oxide semiconductor. The crystal of the oxide semiconductor may have a vertical directionality.

Figure 7C:
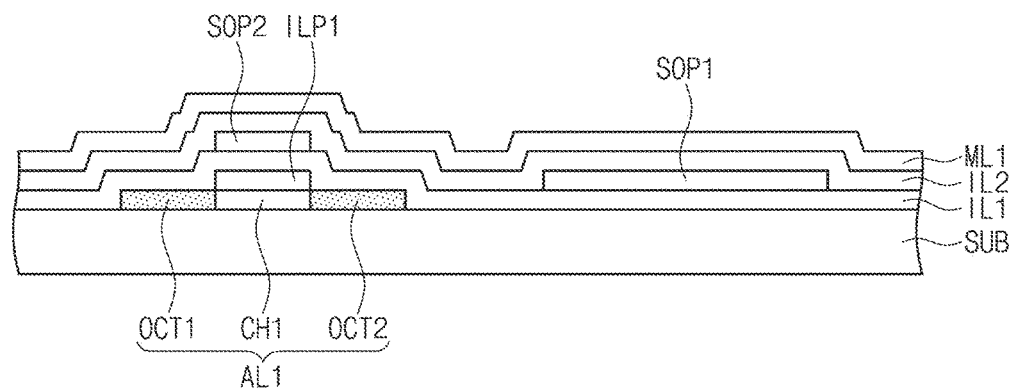

Referring to FIG. 6 and FIG. 7C, the first and second oxide semiconductor patterns SOP1 and SOP2 are covered by the second insulating layer IL2. The second insulating layer IL2 may comprise an inorganic material of silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials. A first metal layer ML1 is formed on the second insulating layer IL2.

Figure 7D:
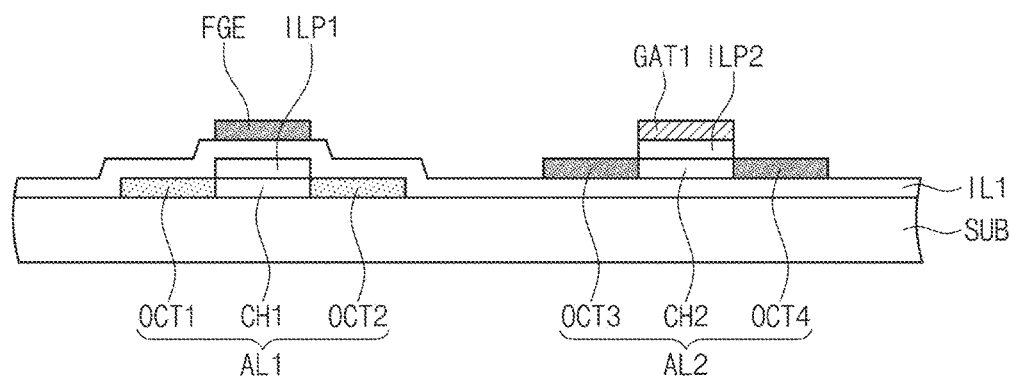

As shown in FIG. 6 and FIG. 7D, a second insulating pattern ILP2 and a first electrode GAT1 are formed by patterning the second insulating layer IL2 and the first metal layer ML1 through the mask process. A hydrogen plasma treatment process is performed on the first and second oxide semiconductor patterns SOP1 and SOP2 using the second insulation pattern ILP2 and the first electrode GAT1 as a mask. In the exemplary embodiment of the present disclosure, the first oxide semiconductor pattern SOP1 includes first to third regions, the second insulating pattern ILP2 and the first electrode GAT1 are disposed on the second region of the first oxide semiconductor pattern SOP1. Therefore, the hydrogen plasma treatment is performed only on the first and third regions of the first oxide semiconductor pattern SOP1 exposed by the first electrode GAT1. In particular, hydrogen (H) or hydrogen oxide (OH) may be included into the first and third regions of the first oxide semiconductor pattern SOP1 during the etching process of the first metal layer ML1. Accordingly, the first and third regions of the first oxide semiconductor pattern SOP1 may be reduced to metal to form the third and fourth contact portions OCT3 and OCT4.

Here, the first electrode GAT1 may be a first gate electrode of the first transistor T1 (shown in FIG. 5) and a lower electrode of the storage capacitor Cst (shown in FIG. 5).

The second region is covered by the first electrode GAT1 and isn't doped with hydrogen during the hydrogen plasma treatment. The second region of the first oxide semiconductor pattern SOP1 is the second channel portion CH2 of the second semiconductor layer AL2.

In addition, the second oxide semiconductor pattern SOP2 is reduced to metal through the etching process of the first metal layer ML1 to form the floating gate FGE. In order to improve metal performance of the floating gate FGE, the hydrogen doping concentration may be about $1E+17/cm^3$ or more.

According to the present disclosure, the floating gate FGE comprises the oxide semiconductor having high conductivity. The oxide semiconductor is advantageous for charging of carrier because the oxide semiconductor has relatively wide band gap and can make trap sites more useful than poly silicon. Therefore, when the floating gate FGE comprises the oxide semiconductor, the ability of changing the threshold voltage Vth to trap or control charge from the floating gate FGE may be improved. Accordingly, the performance of the second transistor T2 can be improved, so the power consumption of the OLED display 400 can be minimized when driving low power consumption.

By simultaneously forming the floating gate FGE in the process of forming the second semiconductor layer AL2, additional processes can be prevented from occurring when the floating gate FGE is formed of an oxide semiconductor.

Figure 7E:
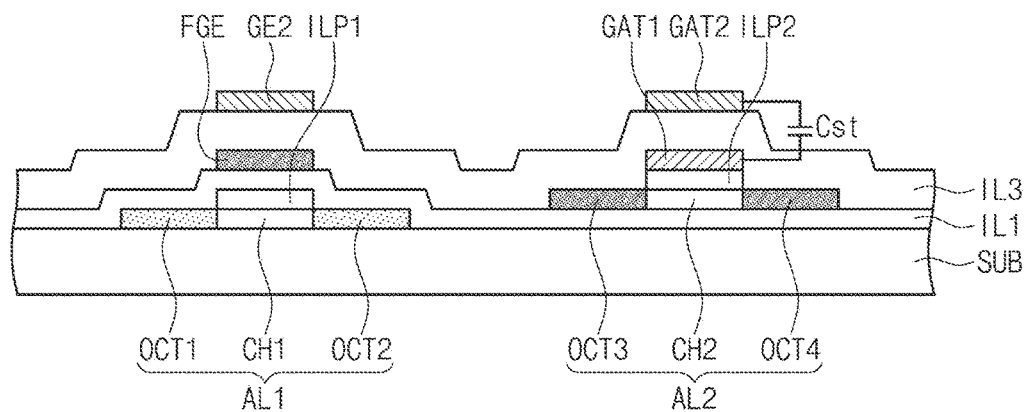

Referring to FIG. 6 and FIG. 7E, the first electrode GAT1 is covered by the third insulating layer IL3, and the second electrode GAT2 and the second gate electrode GE2 are formed on the third insulating layer IL3. The third insulating layer IL3 may comprise an inorganic material of silicon oxide SiOx, silicon nitride SiNx, silicon oxynitride SiON, fluorinated silicon oxide SiOF or aluminum oxide AlOx, etc., or an organic material, and comprise a single layer or multi layers having at least one of the above materials.

The second electrode GAT2 is an upper electrode of the storage capacitor Cst and faces the first electrode GAT1 on the third insulating layer IL3. The second gate electrode GE2 is formed to face the floating gate FGE on the third insulating layer IL3.

Although not shown in the figures, the i-th scan line SLi, the i-th light emitting line ELi, and the (i−1)th light emitting line ELi−1 shown in FIG. 4 are further disposed on the third insulating layer IL3.

Figure 7F:
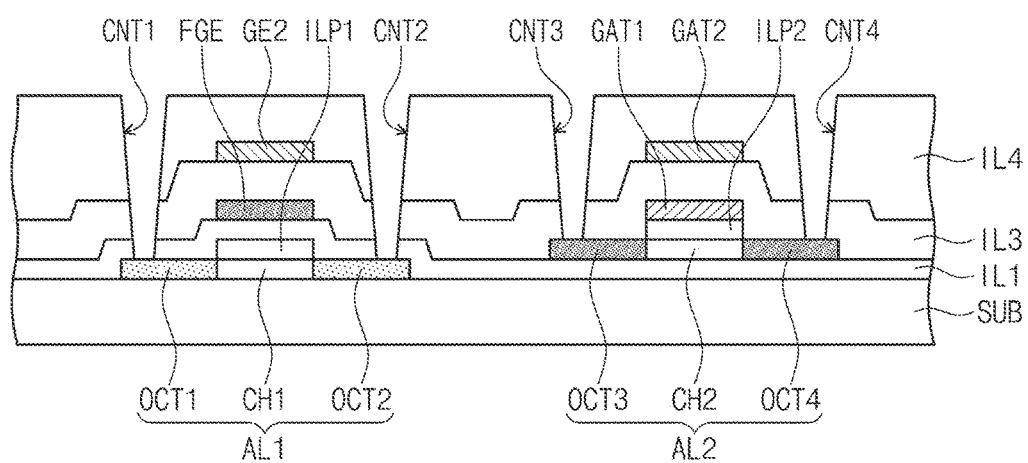

Referring to FIG. 6 and FIG. 7F, the second electrode GAT2 and the second gate electrode GE2 are covered by the fourth insulating layer IL4. The fourth insulating layer IL4 may comprise one of the inorganic material and the organic material.

A first contact hole CNT1 and a second contact hole CNT2 are formed through the first to fourth insulating layers IL1 to IL4 to expose the first and second contact portions OCT1 and OCT2. Also, a third contact hole CNT3 and a fourth contact hole CNT4 are formed through the second to fourth insulating layers IL2 to IL4 to expose the third and fourth contact portions OCT3 and OCT4.

Figure 7G:
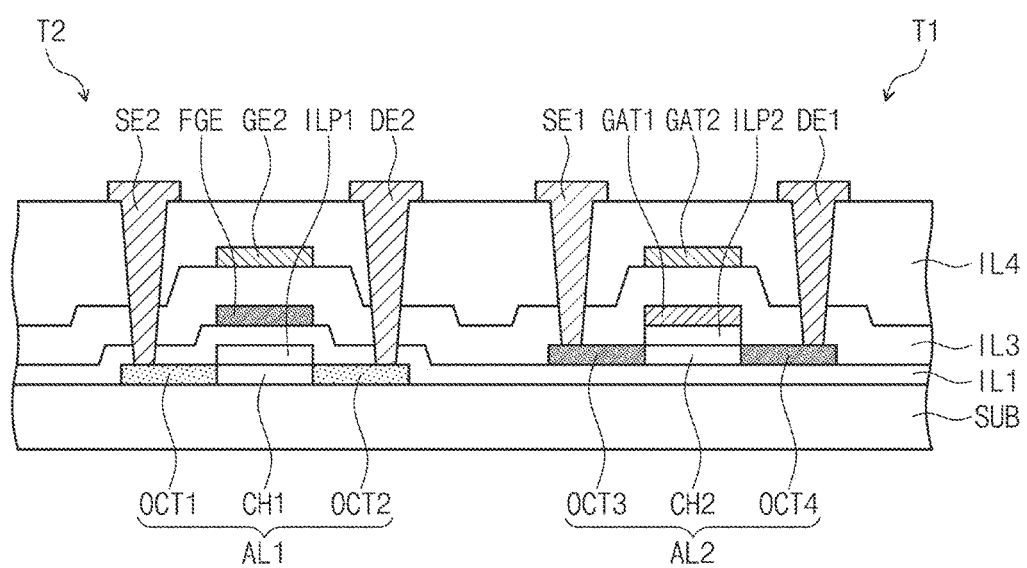

Referring to FIG. 6 and FIG. 7G, a first source electrode SE1 and a first drain electrode DE1 of the first transistor T1 are formed on the fourth insulating layer IL4, and a second source electrode SE2 and a second drain electrode DE2 of the second transistor T2 are formed on the fourth insulating layer IL4. The second source electrode SE2 of the second transistor T2 is contacted with the first contact portion OCT1 through the first contact hole CNT1, and the second drain electrode DE2 is contacted with the second contact portion OCT2 through the second contact hole CNT2. The first source electrode SE1 of the first transistor T1 is contacted with the third contact portion OCT3 through the third contact hole CNT3, and the first drain electrode DE1 is contacted with the fourth contact portion OCT4 through the fourth contact hole CNT4.

Although not shown in the figures, the third source electrode and drain electrodes of the third transistor T3 (shown in FIG. 5), the k-th data line DLk (shown in FIG. 5) and the power line PL (shown in FIG. 5) are further formed on the fourth insulating layer IL4.

In the figures, the structure of the first transistor T1 with the second semiconductor layer AL2 is shown, but the third transistor T3 may also comprise the second semiconductor layer AL2.

Referring again to FIG. 6, the first and second source electrodes SE1 and SE2, the first and second drain electrodes DE1 and DE2 are covered by a fifth insulating layer IL5. The fifth insulating layer IL5 may comprise one of the inorganic material and the organic material. The fifth insulating layer IL5 may be formed of an organic insulating material to provide a flat surface.

A fifth contact hole CNT5 is formed through the fifth insulating layer IL5 and the first drain electrode DE1 is partially exposed via the fifth contact hole CNT5. The anode AE of the organic light emitting diode ED is formed on the fifth insulating layer IL5.

A pixel define layer PDL is disposed on the fifth insulating layer, on which the anode AE is formed. An opening OP is defined in the pixel define layer PDL to expose at least a portion of the anode AE. An organic light emitting layer (not shown) is disposed on the anode AE so as to overlap the opening OP. A cathode (not shown) is disposed on the organic light emitting layer.

Although not shown in the figures, an encapsulation layer may be disposed on the cathode to cover the organic light emitting diode ED. The encapsulation layer may comprise a plurality of inorganic layers and a plurality of organic layers which are alternately stacked with each other.

In the OLED display 400 according to the present disclosure, the second transistor T2 having a structure of the memory transistor is illustrated as an example, but is not limited thereto. A memory transistor according to the present inventive concept may be employed for a pixel of a liquid crystal display device. Hereinafter, referring to FIG. 8 and FIG. 9, the structure of the memory transistor employed in the pixel of the liquid crystal display device will be described in detail.

Figure 8:
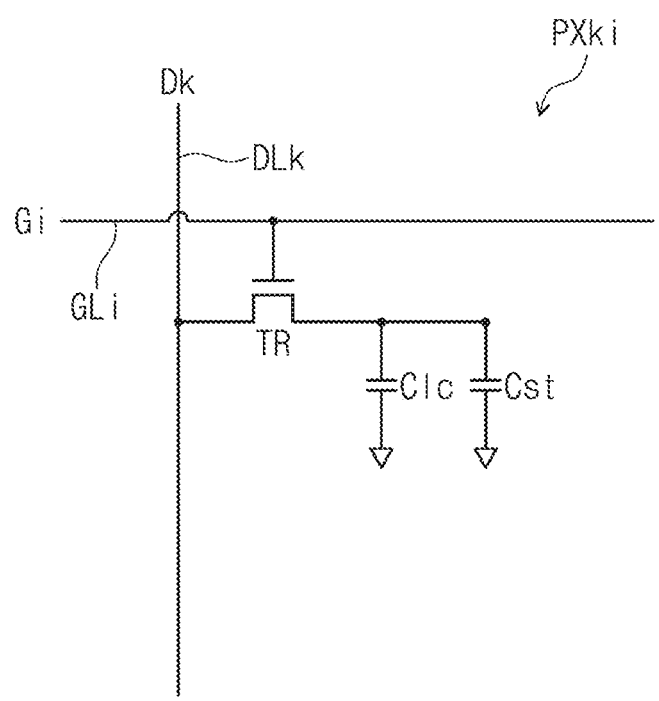
FIG. 8 is a circuit diagram showing a pixel according to an exemplary embodiment of the present disclosure.
Figure 9:
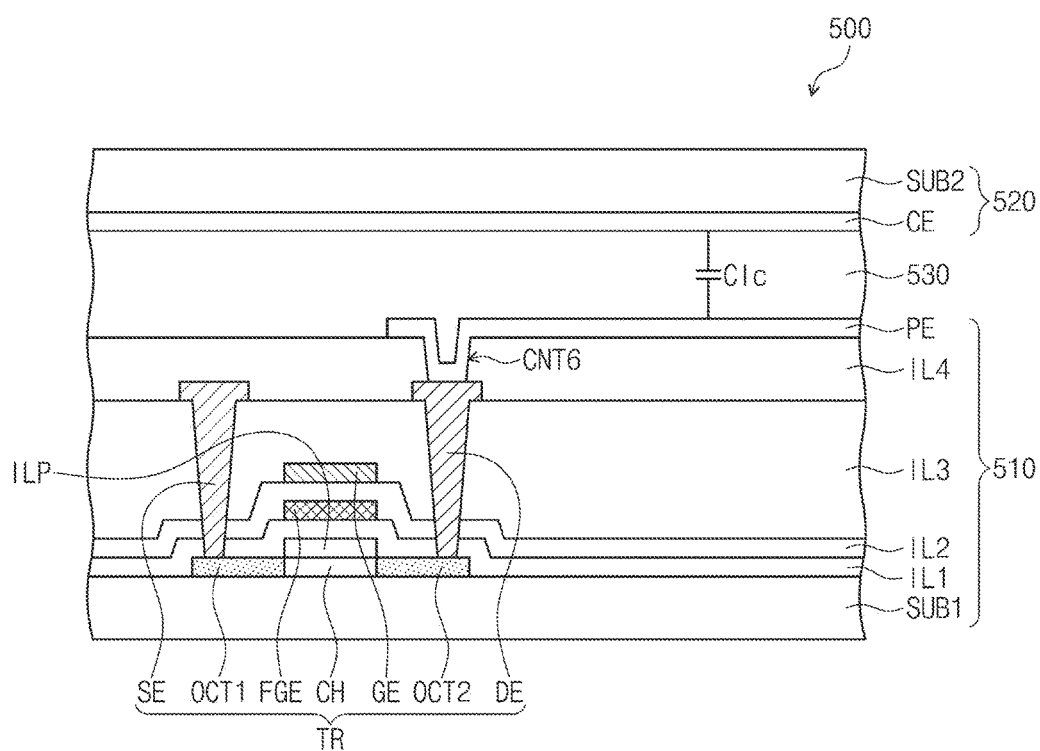
FIG. 9 is a cross-sectional view showing the pixel shown in FIG. 8.

FIG. 8 is a circuit diagram showing a pixel according to an exemplary embodiment of the present disclosure, and FIG. 9 is a cross-sectional view showing the pixel shown in FIG. 8.

Referring to FIG. 8 and FIG. 9, a pixel PXki according to an exemplary embodiment of the present disclosure comprises a pixel transistor TR, a liquid crystal capacitor Clc, and a storage capacitor Cst. The pixel transistor TR comprises a gate electrode connected to an i-th gate line GLi, a source electrode connected to a k-th data line DLk, and a drain electrode connected to the liquid crystal capacitor Clc. The pixel transistor TR may be a memory transistor having the floating gate FGE. In the exemplary embodiment of the present disclosure, the floating gate FGE may be formed of an oxide semiconductor.

The pixel transistor TR is turned on in response to an i-th gate voltage Gi applied to the i-th gate line GLi, and a k-th data voltage Dk applied to the k-th data line DLk is charged to the liquid crystal capacitor Clc through the turned-on pixel transistor TR.

Referring to FIG. 9, a liquid crystal display panel 500 employed in the liquid crystal display device comprises a first substrate 510, a second substrate 520 facing the first substrate 510, and a liquid crystal layer 530 disposed between the first substrate 510 and the second substrate 520.

The first substrate 510 comprises a first base substrate SUB1, the pixel transistor TR disposed on the first base substrate SUB1 and a first electrode PE of the liquid crystal capacitor Clc.

The pixel transistor TR provided on the first base substrate SUB1 has substantially a same structure as the second transistor T2 shown in FIG. 5, so detailed description of the pixel transistor TR will be omitted. However, since the pixel shown in FIG. 8 has one transistor, only one insulating layer (for example, the second insulating layer IL2) is disposed between the floating gate FGE and the gate electrode GE, the other structures are almost same as the second transistor T2.

The first substrate 510 comprises a fourth insulating layer IL4, and a sixth contact hole CNT6 is formed through the fourth insulating layer IL4 to expose the drain electrode DE of the pixel transistor TR. A pixel electrode PE is disposed on the fourth insulating layer IL4. The pixel electrode PE is utilized as the first electrode of the liquid crystal capacitor Clc.

The second substrate 520 comprises a second base substrate SUB2 and a common electrode CE disposed on the second base substrate SUB2. The common electrode CE faces the pixel electrode PE with the liquid crystal layer 530 interposed therebetween to form the liquid crystal capacitor Clc using the liquid crystal layer 530 as a dielectric layer.

In order to change the threshold voltage Vth of the pixel transistor TR, a low-power gate voltage may be applied to the gate electrode of the pixel transistor TR during a low-power driving period for displaying a still image, etc. The low-power gate voltage may be higher than a normal gate voltage.

In the exemplary embodiment of the present disclosure, the low-power gate voltage is a voltage applied to the gate lines of the liquid crystal display device during the low-power driving period, and the normal gate voltage is a voltage applied to the gate lines of the liquid crystal display device during a normal driving period.

During the low-power driving period, when the low-power gate voltage is applied to the gate lines, a charge is trapped in the floating gate FGE, and thus the threshold voltage Vth of the pixel transistor TR is shifted to the plus (+) side. According to the present disclosure, the floating gate FGE comprises the oxide semiconductor having high conductivity. The oxide semiconductor is advantageous for charging of carrier because the oxide semiconductor has relatively wide band gap and can make trap sites more useful than poly silicon. Therefore, when the floating gate FGE comprises the oxide semiconductor, the ability of changing the threshold voltage Vth to trap or control charge from the floating gate FGE may be improved.

Accordingly, the performance of the pixel transistor TR can be improved, thereby reducing the leakage current generated in the pixel transistor TR during the low-power driving period. As a result, the power consumption of the liquid crystal display device 500 can be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A display device comprising:
    a gate line;
    a data line;
    a switching transistor connected to the gate line and the data line; and
    a driving transistor connected to an anode of an organic light emitting diode,
    wherein the switching transistor comprising:
        a first semiconductor layer comprising a first channel portion, a first contact portion and a second contact portion;
        a first floating gate facing the first channel portion of the first semiconductor layer;
        a first gate electrode facing the first floating gate; and
        a first source electrode and a first drain electrode contacted with the first contact portion and the second contact portion, respectively, wherein the first floating gate comprises an oxide semiconductor, and
    wherein the driving transistor comprising:
        a second semiconductor layer which comprises a second channel portion, a third contact portion, and a fourth contact portion, the second semiconductor layer being a material different from the first semiconductor;
        a second floating gate facing the second channel portion of the second semiconductor layer;
        a second gate electrode facing the second floating gate; and a second source electrode and a second drain electrode contacted with the third contact portion and the fourth contact portion, respectively, wherein the second floating gate comprises a metal that is not the oxide semiconductor.

2. The display device of claim 1, wherein the organic light emitting diode has the anode and a cathode.

3. The display device of claim 2, further comprising:
a control transistor controlling the operation of the driving transistor.

4. The display device of claim 3, wherein the control transistor comprises a plurality of transistor, at least one of the plurality of transistor is the switching transistor.

5. The display device of claim 3, wherein the first semiconductor layer comprises poly silicon.

6. The display device of claim 5, wherein the second semiconductor layer comprises an oxide semiconductor.

7. The display device of claim 6, further comprising:
a first insulating layer covering the first semiconductor layer, wherein the floating gate and the second semiconductor layer are disposed on the first insulating layer; and
a second insulating layer covering the floating gate and the second semiconductor, wherein the gate electrode is disposed on the second insulating layer.

8. The display device of claim 7, wherein each of the first insulating layer and the second insulating layer comprises an inorganic material such as silicon oxide SiOx, silicon nitride SiNx, silicon oxynitride SiON, fluorinated silicon oxide SiOF or aluminum oxide AlOx, or an organic material.

9. The display device of claim 2, wherein the oxide semiconductor comprises zinc oxide ZnO, zinc-tin oxide ZTO, zinc-indium oxide ZIO, indium oxide InO, titanium oxide TiO, indium-gallium-zinc oxide IGZO or indium-zinc-tin oxide IZTO.

10. The display device of claim 9, wherein the oxide semiconductor comprises the IGZO having a hydrogen doping concentration of $1E+17/cm^3$ or more.

11. The display device of claim 1, wherein the display element comprises a liquid crystal capacitor.

12. The display device of claim 11, wherein the switching transistor is a pixel transistor connected to a first electrode of the liquid crystal capacitor.

* * * * *